(12) United States Patent
Twitchen

(10) Patent No.: US 11,062,973 B2
(45) Date of Patent: Jul. 13, 2021

(54) SYNTHETIC DIAMOND HEAT SPREADERS

(71) Applicant: ELEMENT SIX TECHNOLOGIES LIMITED, Didcot (GB)

(72) Inventor: Daniel James Twitchen, Didcot (GB)

(73) Assignee: Element Six Technologies Limited, Didcot (GB)

(*) Notice: Subject to any disclaimer, the term of this patent is extended or adjusted under 35 U.S.C. 154(b) by 0 days.

(21) Appl. No.: 16/308,376

(22) PCT Filed: Jun. 8, 2017

(86) PCT No.: PCT/EP2017/064003
§ 371 (c)(1),
(2) Date: Dec. 7, 2018

(87) PCT Pub. No.: WO2017/211977
PCT Pub. Date: Dec. 14, 2017

(65) Prior Publication Data
US 2019/0139857 A1 May 9, 2019

(30) Foreign Application Priority Data

Jun. 9, 2016 (GB) .................................... 1610053

(51) Int. Cl.
*H01L 23/373* (2006.01)
*C23C 16/27* (2006.01)
*H01L 29/20* (2006.01)

(52) U.S. Cl.
CPC .......... *H01L 23/3732* (2013.01); *C23C 16/27* (2013.01); *C23C 16/278* (2013.01); *H01L 23/3735* (2013.01); *H01L 29/2003* (2013.01)

(58) Field of Classification Search
CPC ............. H01L 23/3732; H01L 23/3735; H01L 29/2003; H01L 21/02527; C23C 16/278; C23C 16/27
See application file for complete search history.

(56) References Cited

U.S. PATENT DOCUMENTS 5,587,013 A   12/1996   Ikegaya et al.
5,648,148 A   7/1997    Simspon
(Continued)

FOREIGN PATENT DOCUMENTS

EP   0469626 A2    2/1992
JP   H04092896 A   3/1992

OTHER PUBLICATIONS

Katcho, N. A., et al. Effect of nitrogen and vacancy defects on the thermal conductivity of diamond: an ab initio Green's function approach. Phys. Rev. B 90, 094117 (2014) (Year: 2014).*
(Continued)

*Primary Examiner* — Lex H Malsawma
*Assistant Examiner* — Gardner W. S. Swan
(74) *Attorney, Agent, or Firm* — Dean W. Russell; Clark F. Weight; Kilpatrick Townsend & Stockton LLP

(57) ABSTRACT

A synthetic diamond heat spreader that includes a first layer of synthetic diamond material forming a base support layer and a second layer of synthetic diamond material disposed on the first layer of synthetic diamond material and forming a diamond surface layer. The diamond surface layer has a thickness equal to or less than a thickness of the base support layer. The diamond surface layer has a nitrogen content less than that of the base support layer. The nitrogen content of the diamond surface layer and the diamond support layer is selected such that the thermal conductivity of the base support layer is in a range 1000 W/mK to 1800 W/mK and the thermal conductivity of the surface support layer is in a range 1900 W/mK to 2800 W/mK.

11 Claims, 8 Drawing Sheets

(a)

(b)

(56) References Cited

U.S. PATENT DOCUMENTS

| | | | |
|---|---|---|---|
| 6,162,412 A | 12/2000 | Fujimori et al. | |
| 9,214,407 B2 | 12/2015 | Twitchen | |
| 2003/0131787 A1 | 7/2003 | Linares et al. | |
| 2007/0017437 A1* | 1/2007 | Genis | C30B 29/04 |
| | | | 117/68 |
| 2012/0051996 A1* | 3/2012 | Scarsbrook | C30B 31/22 |
| | | | 423/446 |
| 2013/0043392 A1* | 2/2013 | Mildren | H01S 3/30 |
| | | | 250/341.1 |
| 2015/0294922 A1 | 10/2015 | Twitchen | |

OTHER PUBLICATIONS

Graebner, J. E., "Thermal Conductivity and the Microstructure of CVD Diamond," 2nd International Conference on the Applications of Diamond Films and Related Materials, 1993, pp. 253-260, MYU, Japan.

Callaway, Joseph, "Model for Lattice Thermal Conductivity at Low Temperatures," Physical Review, Feb. 15, 1959, pp. 1046-1051, vol. 113, No. 4, American Physical Society.

International Patent Application No. PCT/EP2017/064003, International Search Report and Written Opinion dated Sep. 18, 2017, 11 pages.

Berman, R., "Thermal Conduction in Solids," 1976, pp. 1-178, Clarendon Press, Oxford, UK.

Wei, Lanhua, et al., "Thermal Conductivity of Isotopically Modified Single Crystal Diamond," Physical Review Letters, Jun. 14, 1993, pp. 3764-3767, vol. 70, No. 24, The American Physical Society.

* cited by examiner (a)

(b)

SYNTHETIC DIAMOND HEAT SPREADERS

FIELD OF INVENTION

The present invention relates to thermal management applications which utilize synthetic diamond heat spreaders.

BACKGROUND OF INVENTION

The promised performance of wide band gap electronic devices (e.g. GaN based) will result in much higher power dissipation and localized heat generation at contacts and in channel regions than can be accommodated by current state-of-the-art thermal management configurations. As a consequence, use of conventional cooling techniques imposes a ceiling on wide band gap device performance and reliability. Overcoming such barriers requires thermal engineering at the macro, micro, and nano-scale, which can provide significant reductions in the near-junction temperature rise and component thermal resistance.

Specific challenges relate to heat spreading in certain types of radio frequency (rf) power devices. In such devices the local power densities can exceed 1 MW/cm$^2$. Spreading this heat and lowering the junction temperature enables increased reliability and also continuous wave performance. In addition to electronic device applications, there is also a need to improve upon current state-of-the-art thermal management configurations in certain extreme optical applications.

Synthetic diamond materials have been proposed as an ideal solution in extreme thermal management applications due to the high in-plane thermal conductivity of such materials. For example, various grades of synthetic diamond material grown by chemical vapour deposition (CVD) are already commercially available for thermal heat spreading applications including both polycrystalline and single crystal synthetic diamond materials.

The thermal performance of a particular synthetic diamond material will depend on its macro, micro, and nano-scale structure. Factors that contribute to thermal performance are those that lead to scattering of phonons within the synthetic diamond material [J. E. Graebner, Diamond Films Technol., (Japan) 3 (1993) p77 includes a survey of phonon scattering in diamond thin films]. For example in synthetic diamond materials factors which lead to scattering of phonons include: intrinsic mechanisms (phonon-phonon related); point defects (e.g. defects such as nitrogen and vacancy clusters); and extended defects (e.g. stacking faults and dislocations). As such, synthetic diamond materials which are optimized for improved thermal performance are those which have reduced defects in terms of both point defects and extended defects. Furthermore, synthetic diamond materials which are optimized for improved thermal performance may also be tailored to reduce intrinsic phonon scattering mechanisms.

Dominant amongst intrinsic phonon scattering mechanisms are those related to the relative masses of $^{12}$C and $^{13}$C. The natural abundance of $^{13}$C is 1.1% meaning that approximately 1 in every 100 atoms has a $^{12}/_{13}$ difference in mass and hence different phonon energy. Isotopically controlled single crystal diamond theory [R. Berman, Thermal Conductivity in Solids (Clarendon Press 1976)] and experiment [e.g. General Electric, L. Wei, P. K. Kuo, R. L. Thomas, T. R Anthony, W. F. Banholzer, Phys Rev Lett 70 (1993) p3764] has shown that bulk thermal conductivity can increase by nearly a factor of two up to 4000 W/mK. As such, it is known in the art that reducing the $^{13}$C content in synthetic diamond materials can reduce intrinsic phonon scattering and increase bulk thermal conductivity, particularly in relation to single crystal synthetic diamond materials. However, one problem with this approach is that such isotopically purified synthetic diamond materials require a fabrication process which utilizes an isotopically purified carbon source. Such isotopically purified carbon sources are expensive and thus while isotopically purified synthetic diamond materials can have improved thermal performance this improvement can be off-set by increased expense resulting in the materials having a reduced commercial viability in certain applications.

U.S. Pat. No. 9,214,407 suggests a solution to the aforementioned problem. U.S. Pat. No. 9,214,407 recognizes that reducing the isotopic abundance of $^{13}$C in a synthetic diamond material can improve the thermal conductivity of the synthetic diamond material. Furthermore, U.S. Pat. No. 9,214,407 recognizes that this increases the expense of the synthetic diamond fabrication process because isotopically purified carbon sources required for such fabrication processes are more expensive than those with a natural isotopic abundance of carbon. Further still, U.S. Pat. No. 9,214,407 recognizes that in heat spreading applications the thermal barrier resistance at the interface between the heat spreader and a heat generating component often dominates the efficiency of the thermal heat spreader, particularly when using synthetic diamond material as the heat spreader.

In light of the above, U.S. Pat. No. 9,214,407 proposes to provide a synthetic diamond heat spreader in which the surface thermal interface layer of the diamond material which is placed in contact with a non-diamond thermal transfer layer is isotopically purified by reducing the amount of $^{13}$C to have an increased thermal conductivity with the bulk of the diamond material being formed of a diamond material which has a natural isotopic abundance of carbon (or at least is not so isotopically purified as the surface thermal interface layer). Such a heat spreader will have improved thermal heat spreading characteristics when compared to a heat spreader which is formed of synthetic diamond material having a natural isotopic abundance of carbon. Furthermore, such a heat spreader will have a thermal heat spreading performance close to that of a diamond heat spreader which is isotopically purified throughout its thickness at a fraction of the cost.

SUMMARY OF INVENTION

Subsequent to U.S. Pat. No. 9,214,407, it has been recognized that there are some problems with implementing the solution as described therein. Isotopically purified gas is expensive, even when only a relatively thin surface layer of diamond material in the heat spreader is fabricated using such a gas. This problem can be mitigated by recirculating the isotopically purified gas from the outlet back to the inlet of a CVD reactor during synthesis to limit the volume of isotopically purified gas required to synthesize a surface layer of isotopically purified diamond material. However, it has been found that a further problem exists in using isotopically purified carbon source gas. Namely, it has been found that commercially available sources of isotopically purified carbon source gas contain significant quantities of impurities, particularly nitrogen. Nitrogen impurities in source gases for CVD diamond synthesis are problematic as nitrogen along with other related defects are incorporated into the CVD diamond material grown using such gases. In addition to such defects within the diamond lattice, the presence of impurities such as nitrogen in the CVD synthesis atmosphere can change growth morphology leading to a reduction in thermal performance in heat spreading applications. For example, lower thermal conductivity polycrystalline CVD diamond material has a smaller grain size and a higher nitrogen content nitrogen compared to higher thermal conductivity polycrystalline CVD diamond material which is formed of large column shaped grains.

In light of the above, it is an aim of certain embodiments of the present invention to provide synthetic diamond materials which have improved thermal performance without significantly increasing fabrication costs, and avoid the problems as outlined above using isotopically purified source gas, leading to more commercially viable products for extreme thermal management applications. According to one aspect of the present invention there is provided a synthetic diamond heat spreader, the synthetic diamond heat spreader comprising:

a first layer of synthetic diamond material forming a base support layer; and a second layer of synthetic diamond material disposed on the first layer of synthetic diamond material and forming a diamond surface layer, wherein the diamond surface layer has a thickness equal to or less than a thickness of the base support layer, wherein the diamond surface layer has a nitrogen content less than that of the base support layer, and wherein the nitrogen content of the diamond surface layer and the diamond support layer is selected such that the thermal conductivity of the base support layer is in a range 1000 W/mK to 1800 W/mK and the thermal conductivity of the surface support layer is in a range 1900 W/mK to 2800 W/mK.

According to a further aspect of the present invention there is provided a device comprising a heat generating component and a synthetic diamond heat spreader as defined above, wherein the diamond surface layer is located adjacent the heat generating component with the diamond surface layer proximal to at least a portion of the heat generating component. The heat generating component may comprise an electronic semiconducting component such as in an electronic device. Alternatively, the heat generating component may comprise an optical component such as in an optical device. The device is advantageously mounted on the diamond surface with the highest thermal conductivity which is usually the growth surface side of the synthetic diamond layer. However, it is also envisaged that diamond growth may be controlled to grow high thermal conductivity diamond material for the first 25 to 50% of a total diamond layer thickness before moving to a faster growth rate, lower thermal conductivity diamond material for the remainder of the layer for reasons of cost and capacity without significantly sacrificing performance. In such an alternative configuration, the highest thermal conductivity diamond material may be located towards the nucleation surface side of the synthetic diamond layer and the device is bonded to the nucleation side of the synthetic diamond layer. Such a configuration can be utilised when fabricating a GaN-on-Diamond wafer where a high thermal conductivity layer of diamond material is initially grown over a GaN wafer (or other compound semiconductor) before moving into a higher growth rate, lower thermal conductivity diamond layer.

The synthetic diamond heat spreader may further comprise a non-diamond thermal transfer layer disposed in contact with the diamond surface layer for transferring heat into the diamond surface layer from a heat generating component which is thermally coupled to the non-diamond thermal transfer layer. The non-diamond thermal transfer layer may be a metallization layer or other bonding layer located between the heat generating component and the diamond surface layer. Alternatively, the heat generating component may form the non-diamond thermal transfer layer disposed in contact with the diamond surface layer for transferring heat into the surface layer.

According to yet another aspect of the present invention there is provided a method of fabricating a synthetic diamond material for use in a heat spreader as defined above, the method comprising:

growing a synthetic diamond material in a chemical vapour deposition reactor using a carbon source gas; and controlling nitrogen concentration in the a chemical vapour deposition reactor during growth to form a two layer diamond structure including a base support layer and a diamond surface layer as defined previously wherein the nitrogen content of the diamond surface layer and the diamond support layer is selected such that the thermal conductivity of the base support layer is in a range 1000 W/mK to 1800 W/mK and the thermal conductivity of the surface support layer is in a range 1900 W/mK to 2800 W/mK.

It should be noted that in this specification thermal conductivity measurements are taken at 300 K using a known laser flash thermal conductivity measurement method.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION

Figure 1:
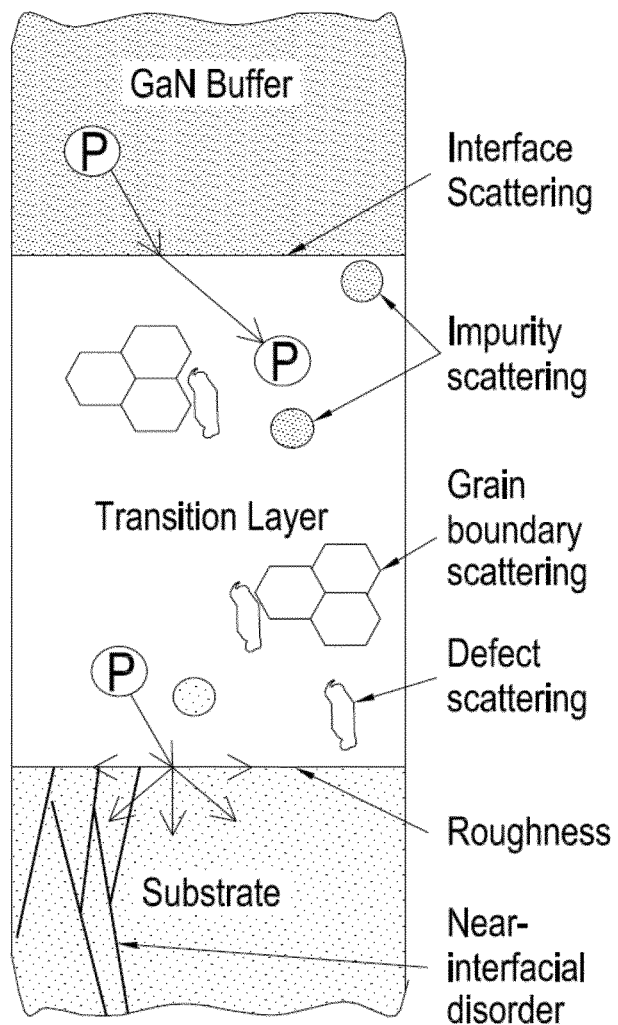
FIG. 1 illustrates phonon scattering mechanisms at an interface region between a thermal substrate and an overlying device layer.

There is a need for improved thermal heat spreading with considerations of cost, thermal performance, dielectric load, package constraints, mechanical robustness, and thermal expansion coefficient issues amongst others. It is important to note that design rules for using a heat spreader often mean considerations other than simple cost versus thermal conductivity come into play. Even issues such as the fragility of a diamond heat spreader must be considered. For example, while most of the thermal performance might be achievable with a 50 micrometre thick diamond heat spreader, the fragility of such a heat spreader or the package design, along with dielectric load considerations, results in a thickness requirement greater than thermal modelling alone would suggest.

Particular classes of devices are pushing power density limits (kW/cm$^2$) for current thermal management solutions. These include radiofrequency (rf) devices, laser diodes, and silicon devices. Some of these devices are now reaching the limit of current heat spreading technologies. Furthermore, there is a continual need to improve thermal performance while reducing cost.

Key figures of merit for thermal performance of synthetic diamond materials are the thermal barrier resistance (TBR) and average bulk thermal conductivity (TC). For high thermal performance it is desirable for the thermal barrier resistance to be minimized while the average bulk thermal conductivity is maximised, i.e. TC/TBR to be as large as possible. In any geometry where synthetic diamond is used in thermal management these properties come into play. For example, in a metallized bonded approach, the thickness of the metal, its thermal conductivity, and interfacial thermal barriers all contribute to an overall thermal barrier resistance, while thermal conductivity then determines the heat spreading capacity of the diamond layer once the heat has travelled through the interface.

To minimize thermal barrier resistance it is desirable to match acoustic velocities between materials, obviously with the best match for synthetic diamond material being diamond on diamond. However, for a number of practical and integration reasons compromises have to be made with the bonding material, hence it is then desirable that all other factors that contribute to thermal barrier resistance are as low as possible.

Factors that contribute to thermal barrier resistance and bulk thermal conductivity in diamond materials are those that lead to scattering of phonons. As previously indicated in the background section, in synthetic diamond material diamond these factors include: intrinsic mechanisms (e.g. due to a natural abundance of $^{13}$C); point defects (e.g. defects such as nitrogen and vacancy related defects); and extended defects (e.g. stacking faults and dislocations). As such, it has been recognized in the prior art that reducing defects and/or fabricating isotopically purified synthetic diamond material can improve thermal performance.

Room temperature thermal conductivity values up to 2500 W/mK have been reported for the highest quality single crystals of type IIa diamond material. In contrast to a metal, where thermal conductivity is provided by the mobility of conduction band electrons, heat transfer in electrically insulating diamond material is solely carried by lattice vibrations, i.e. phonons. The reason for the outstanding thermal conductivity of diamond material, and its high Debye-temperature of 2000 K, is the stiffness of the sp$^3$ bonds forming its rigid structure together with the low mass of carbon atoms. In most applications, the temperature is well below the Debye temperature and, hence, phonon-phonon scattering is small, resulting in little impedance for the phonon-mediated heat transport in a large high purity diamond crystal.

Extrinsic phonon scattering mechanisms are the main source of thermal resistance in less pure diamond material. For single crystal diamond material, scattering at the sample's boundaries, at impurities, and at vacancies are the main contributions. For polycrystalline diamond materials, additional contributions arise from scattering at grain boundaries, dislocations, and extended defects. All contributions influencing thermal conductivity depend on the wavelength of the contributing phonons and, therefore, on the temperature of the sample. Hence, for understanding phonon scattering mechanisms and their relative contributions, measurements of the temperature dependent thermal conductivity are of basic importance.

Thermal conductivity and thermal resistance are macroscopic quantities that are related to microscopic properties by the gas kinetic definition of thermal conductivity based on phonons as quantized lattice vibrations. In this physical picture, thermal conductivity K can be described by $$K=(\tfrac{1}{3})Cv^2\tau^1$$

where C is the phonon contribution to the heat capacity per unit volume, v is the velocity of the phonons, and $\tau$ is the phonon scattering rate. As phonons of different wavelengths, ranging over a temperature dependent spectrum, contribute to the thermal transport, a more complete description of K according to the Klemens-Callaway model can be given by integration over the temperature-dependent Debye phonon wavelength spectrum.

Phonon-phonon scattering occurs at vacancies and impurity sites in diamond material where the scattering rate depends on the wavelength of the phonons. For extended defects like clusters or aggregates of foreign or disordered atoms with a size much smaller than the wavelength of the lattice vibrations, scattering is similar to that at point defects. For phonon wavelengths similar in size to extended defects, the scattering rate becomes independent of the phonon wavelength. Dislocations are another source of thermal resistance, since the phonons are scattered in the strain field in the vicinity of dislocations. Scattering at boundaries is most important at lowest temperatures where the phonon wavelength is comparable to or larger than the geometrical dimensions of the crystal. The type of reflection, i.e. specular or diffuse, critically depends on the microstructure of the boundaries and determines the impact on thermal resistance.

In high quality material, the thermal conductivity is determined by the purity of the crystal. The most important impurities for lowering thermal conductivity are nitrogen, hydrogen, and the $^{13}$C isotope of carbon. The purest type IIa material has the highest thermal conductivity while in type Ia and Ib material having nitrogen impurities, thermal conductivity is significantly lower. Several groups have measured the thermal conductivity of natural single crystal diamond as a function of temperature.

FIG. 1 illustrates phonon scattering mechanisms at an interface region between a thermal substrate and an overlying device layer. The illustrated device structure comprises a gallium nitride buffer layer disposed over a diamond substrate layer with a transition layer disposed therebetween. A phonon located within the gallium nitride layer propagates into the transition layer and is subject to interface scattering, impurity scattering, grain boundary scattering, and crystal defect scattering. A phonon located within the transition region then propagates into the substrate layer and is also subject to scattering mechanisms including via surface roughness and near-interfacial disorder within the diamond substrate.

Figure 2:
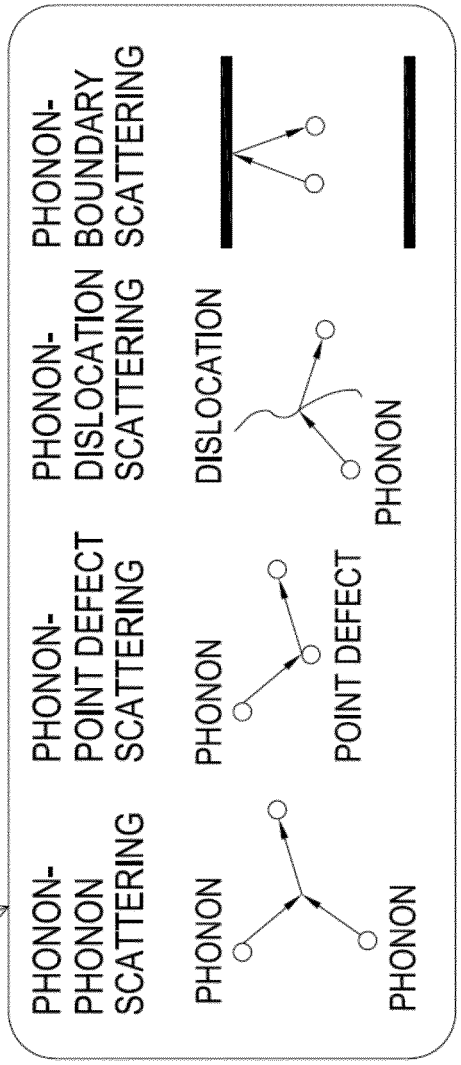
FIG. 2 illustrates the underlying theory for phonon transport at an interface region between a thermal substrate and an overlying device layer.

FIG. 2 illustrates the underlying theory for phonon transport at an interface region between a thermal substrate and an overlying device layer. An approximate solution to the phonon Boltzmann transport equation includes terms which are a function of heat capacity, group velocity, and scattering time. The scattering term will include contributions from a range of scattering mechanisms including phonon-phonon scattering, phonon-point defect scattering, phonon-dislocation scattering, and phonon-boundary scattering as illustrated. This analysis is taken from J. Callaway, Physic. Rev, vol. 113, 1959. In the prior art the analysis has been performed for a gallium nitride layer disposed over a silicon carbide substrate with an aluminum nitride interface layer disposed therebetween. However, the analysis is equally applicable to diamond heat spreading substrates and indeed, as previously described, scattering effects at the thermal interface can be more important for diamond materials.

Figure 3:
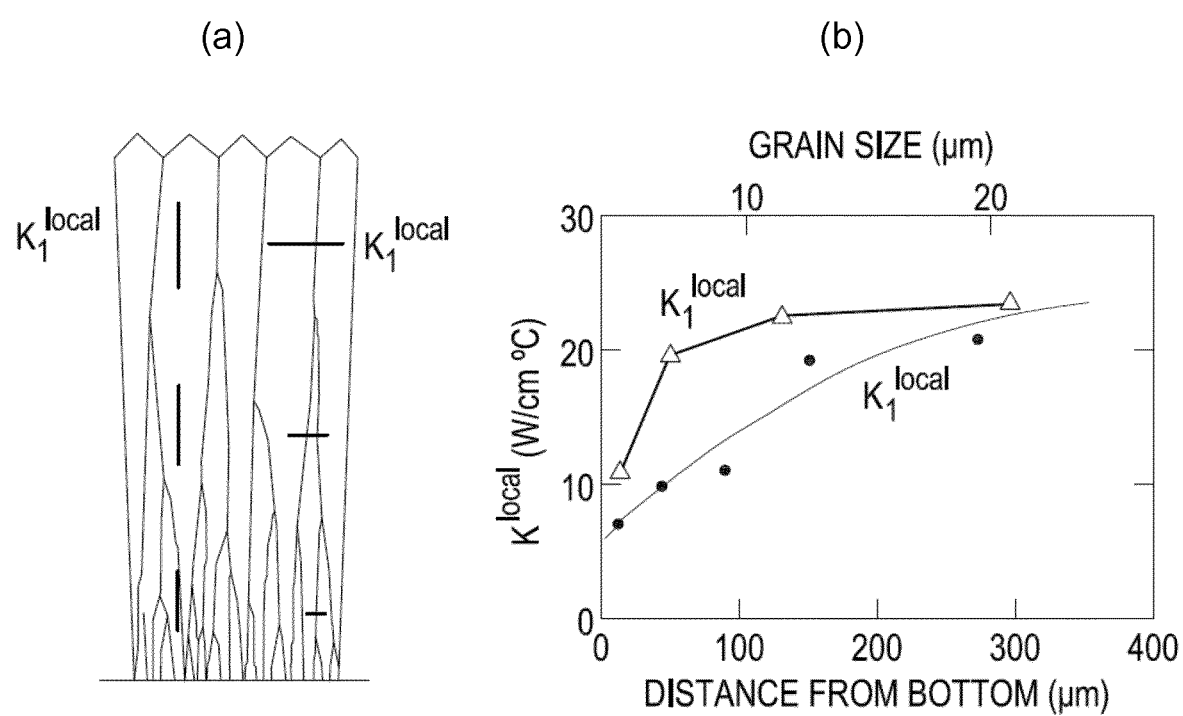
FIGS. 3(a) and 3(b) illustrate how thermal conductivity of polycrystalline CVD synthetic diamond material increases on passing from a nucleation face of the polycrystalline CVD synthetic diamond material to a growth face of the polycrystalline CVD synthetic diamond material.

It is known that the nucleation face of a polycrystalline CVD synthetic diamond wafer has smaller grain size and lower thermal conductivity than the growth face of a polycrystalline CVD synthetic diamond wafer. FIGS. 3(a) and 3(b) illustrate how thermal conductivity of polycrystalline CVD synthetic diamond material increases on passing from a nucleation face of the polycrystalline CVD synthetic diamond material to a growth face of the polycrystalline CVD synthetic diamond material. As such, given the choice of which face of a polycrystalline CVD synthetic diamond wafer should be located close to a heat generating component, one would choose the growth face having the larger grain size and lower crystal defect content.

The highest quality polycrystalline CVD synthetic diamond materials can also have thermal conductivities where phonon processes due to point defects are one of the dominant, if not the dominant, scattering mechanism reducing thermal conductivity and thermal barrier resistance. In this regard, it may be noted that the thermal conductivity of lower quality polycrystalline CVD synthetic diamond material is thought to be dominated by extended defects while the thermal conductivity of high quality polycrystalline CVD synthetic diamond materials can be dominated by point defects.

Figure 4:
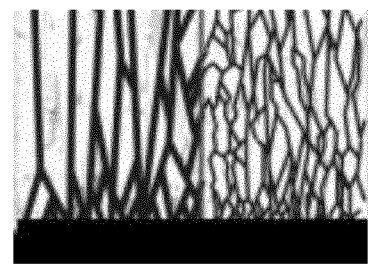
FIG. 4 illustrates the different grain structures for high thermal conductivity polycrystalline CVD diamond material and lower thermal conductivity polycrystalline CVD diamond material.

FIG. 4 illustrates the different grain structures for high thermal conductivity "Optical Grade" polycrystalline CVD diamond material (left hand side of FIG. 4) and lower thermal conductivity "Mechanical Grade" polycrystalline CVD diamond material (right hand side of FIG. 4). As clearly illustrated, the high thermal conductivity "Optical Grade" polycrystalline CVD diamond material consists of large column shaped grains. In contrast, the lower thermal conductivity "Mechanical Grade" polycrystalline CVD diamond material consists of smaller grains with a more random grain structure.

Figure 5:
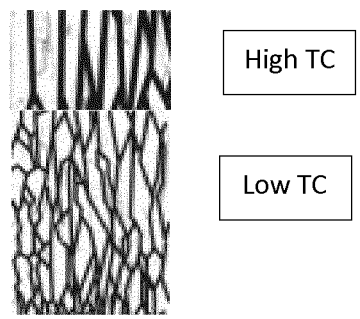
FIG. 5 illustrates a two layer synthetic diamond heat spreader structure in accordance with an embodiment of the present invention.

FIG. 5 illustrates a two layer synthetic diamond heat spreader structure in accordance with an embodiment of the present invention. The structure comprises a base layer of lower thermal conductivity polycrystalline CVD diamond material and a surface layer of higher thermal conductivity polycrystalline CVD diamond material. The base layer consists of smaller grains with a more random grain structure compared to the surface layer which consists of large column shaped grains. The base layer also comprises a higher nitrogen content than the surface layer. Such a structure can be synthesized in a single CVD growth process by changing growth conditions part-way through the growth process to switch from a higher nitrogen, higher growth rate synthesis process to a lower nitrogen, lower growth rate synthesis process. Alternatively, after growth of the base layer the wafer may be removed from the CVD reactor and surface processed prior to growth of the surface layer.

A synthetic diamond heat spreader is provided which comprises:
  a first layer of synthetic diamond material forming a base support layer; and
  a second layer of synthetic diamond material disposed on the first layer of synthetic diamond material and forming a diamond surface layer,
  wherein the diamond surface layer has a thickness equal to or less than a thickness of the base support layer,
  wherein the diamond surface layer has a nitrogen content less than that of the base support layer, and
  wherein the nitrogen content of the diamond surface layer and the diamond support layer is selected such that the thermal conductivity of the base support layer is in a range 1000 W/mK to 1800 W/mK, optionally 1000 W/mK to 1500 W/mK, and the thermal conductivity of the surface support layer is in a range 1900 W/mK to 2800 W/mK, optionally 1900 W/mK to 2500 W/mK or 2000 W/mK to 2200 W/mK.

The synthetic diamond heat spreader is fabricated by: growing a synthetic diamond material in a chemical vapour deposition reactor using a carbon source gas; and controlling nitrogen concentration in the a chemical vapour deposition reactor during growth to form a two layer diamond structure including a base support layer and a diamond surface layer wherein the nitrogen content of the diamond surface layer and the base support layer is selected such that the thermal conductivity of the base support layer is in a range 1000 W/mK to 1800 W/mK and the thermal conductivity of the surface support layer is in a range 1900 W/mK to 2800 W/mK.

The combination of layers as described herein has been calculated to provide most of the thermally benefits of a heat spreader manufactured entirely from high thermal conductivity diamond material while provide significant cost reductions. It is important to note that certain classes of power devices typically create a small heat spot, requiring a maximum heat spreading capability consistent with a total thickness (which may be larger than the optimal thickness of spreader) while a competitive cost position means 10-50% cost reduction options are required. In this regard, high thermal conductivity diamond materials generally grow slowly meaning thick (e.g. 1 mm) diamond heat spreaders are not only more expensive than thinner alternatives but have a significant impact on production capacity. As such, it has been found to be advantageous to provide a diamond heat spreader comprising a lower grade and a higher grade of diamond material, advantageously grown within a single growth run, to give thermal performance comparable with a uniform heat spreader of the high diamond grade with the benefit of reduced cost and increased capacity/reactor. This solution is advantageous over the previously disclosed isotopic purification approach which does not provide higher growth rates and the same reduced cost and increased capacity/reactor as compared with the presently described solution. Embodiments of the present invention are particularly relevant for those classes of devices that require a heat spreader with a thermal conductivity in excess of 1500 W/mK.

The nitrogen content of the diamond surface layer may be in a range 0.25-5 ppm ($N_s^0$ as measured by EPR). Furthermore, the nitrogen content of the base support layer may be in a range 2-10 ppm ($N_s^0$ as measured by EPR). This may be achieved by switching from a higher nitrogen content CVD growth recipe to a lower nitrogen content growth recipe part-way through the fabrication process. For polycrystalline CVD diamond heat spreaders, the average grain size of the diamond surface layer is larger than the average grain size of the base support layer. The two layers of diamond material can be readily discerned in terms of their grain texture as well as via nitrogen concentration measurements.

The base support layer may have a thickness of no less than 50 µm, 100 µm, 130 µm, 150 µm, 180 µm, 200 µm, 250 µm, 350 µm, 500 µm, or 1000 µm, optionally less than 3000 µm. At least 50%, 60%, 70%, 80%, or 90% of the thickness of the synthetic diamond material may be formed of the base support layer. The thickness of the base support layer will be dependent on both thermal performance requirements and mechanical strength requirements for a particular end application. Thermal applications usually require a minimum total thickness of diamond material in order to achieve the maximum thermal benefit from utilizing diamond material. For example, in certain radio frequency power devices it has been found that a diamond heat spreader thickness of about 150 µm is required to achieve the maximum thermal benefit from utilizing diamond material but that the thermal barrier resistance is dominated by only the first few microns. In addition, for certain applications the synthetic diamond material will be required to have sufficient mechanical strength that it can form a free-standing wafer. At the same time, it should be recognized that the synthetic diamond material should not be made unduly thick unless required for a particular application as this will increase costs. It is envisaged that the largest benefits will be achieved by applying the present invention to configurations which require a relative thick diamond wafer which would be very costly to grow entirely from high purity, low nitrogen, high thermal conductivity synthetic diamond material.

The diamond surface layer may have a thickness of no more than 300 µm, 250 µm, 200 µm, 150 µm, 100 µm, or 50 µm, optionally no less than 20 µm. Increasing the thickness of the diamond surface layer may increase thermal performance of the heat spreader but with an associated increase in cost. As such, the precise thickness of the diamond surface layer, in addition to the precise nitrogen content of the diamond surface layer, will be dependent on a cost versus performance analysis for a particular application.

According to certain embodiments the synthetic diamond material includes only two layers, i.e. the base support layer and the diamond surface layer as previously defined. However, in certain embodiments further layers may be provided. That said, in order to achieve the combination of high thermal performance and low fabrication cost, a cheaper base support layer should form the majority of the synthetic diamond material.

In relation to the above, it is important to note that a transition region can be identified between two layers of diamond material having different thermal conductivities formed in accordance with the present invention. The transition cannot take any less time than the roughness of the diamond surface at the initiation of a transition in the synthesis process. Diamond surface roughness during polycrystalline CVD diamond growth is approximately 10% of the growth thickness of the diamond material. Accordingly, for an initial diamond layer of 300 micrometres thickness, the quickest one can transition to a second layer of diamond material of different thermal conductivity is after 30 micrometres of growth over the initial layer of 300 micrometres thickness. As such, a transition region of at least 30 micrometres thickness will be present in the final product when the thickness of the initial layer of diamond material is 300 micrometres.

Of critical note is the importance to make the transition as abrupt as possible. In part this is impacted by the developing texture and grain roughness. While these can be reduced by stopping the synthesis process, processing the growth face flat, and then starting a new synthesis run on the processed surface, the cost and complexity of this is not desirable, although remains an option. In the case where the growth transitions from layer 1 to layer 2 of diamond material, the transition layer as defined by the average thickness of growth needed to move from average bulk thermal properties of layer 1 to layer 2 is <30%, preferably <20%, and most preferably <15% of the layer 1 thickness.

The synthetic diamond material may be polycrystalline CVD synthetic diamond material. The polycrystalline CVD synthetic diamond material may have a largest linear dimension of at least 50 mm, 60 mm, 70 mm, 80 mm, 90 mm, 100 mm, 110 mm, 120 mm, 130 mm, or 140 mm, optionally less than 200 mm, 150 mm, or 145 mm. Alternatively, the synthetic diamond material may be single crystal CVD synthetic diamond material.

The synthetic diamond heat spreader may further comprise a non-diamond thermal transfer layer disposed in contact with the diamond surface layer for transferring heat into the diamond surface layer from a heat generating component which is thermally coupled to the non-diamond thermal transfer layer. The non-diamond thermal transfer layer may be bonded to the surface layer of the synthetic diamond material or may be merely placed in contact with the surface layer of the synthetic diamond material.

The non-diamond thermal transfer layer may comprise at least one of: a metal layer; a silicon or silicon carbide layer; a compound semiconductor layer; or an adhesive. For example, the non-diamond thermal transfer layer may comprise a metal layer disposed on the surface layer of synthetic diamond material. This may be achieved by metallization of the surface layer, such as a titanium/platinum/gold metallization. Such metallization can be patterned and can function to provide bonding and/or electrical connections. Alternatively, the non-diamond thermal transfer layer may comprise an inorganic layer such as a layer of silicon or silicon carbide which can function as a growth layer for subsequent deposition of a compound semiconductor device layer structure thereon.

The non-diamond thermal transfer layer may comprise one or more compound semiconductor layers, e.g. one or more nitride layers including gallium nitride. Such materials are advantageous for use in high power electronic applications where efficient thermal heat spreading is required. These compound semiconductor layers may be placed in direct contact with the surface layer of synthetic diamond material or bonded via a metal layer or an inorganic layer as previously described.

The advantageous technical effects of the present invention are best implemented when operating at high power densities and particularly when integrated into a high power density semiconductor component. The equivalent CW areal power density of the semiconductor component may be at least 1 kW/cm$^2$, 2 kW/cm$^2$, 5 kW/cm$^2$, 10 kW/cm$^2$, 20 kW/cm$^2$, 50 kW/cm$^2$ or 100 kW/cm$^2$, 1 MW/cm$^2$, 2 MW/cm$^2$, 4 MW/cm$^2$, 6 MW/cm$^2$, 8 MW/cm$^2$, or 10 MW/cm$^2$. Alternatively, or additionally, the linear power density of the semiconductor component may be at least 1 W/mm, 2 W/mm, 2.5 W/mm, 3 W/mm, 4 W/mm, 6 W/mm, 8 W/mm, or 10 W/mm. It has been found that in general the larger the power density the larger the benefits of using a very high thermal conductivity diamond surface layer adjacent the semiconductor device component. The most suitable power density definition will depend on the type of semiconductor device. For high power density RF devices the power density is usually defined as a linear power density in terms of Watts per unit gate width. However, for other devices such as laser diodes, light emitting diodes, power switches and microprocessors an areal power density measurement is more appropriate. In the latter case it is the area of the active region which is key, be it light emitting or current switched.

Yet another alternative is that the surface layer of synthetic diamond material is placed in contact with an optical component such as a mirror, lens, prism, etalon, optical window, or laser material. In this case the optical component can form the non-diamond thermal transfer layer. Such a configuration is advantageous in high energy optical applications where optical components can be subject to heating which requires very efficient thermal heat spreading to prevent adverse effects such as increases in optical absorbance and/or thermal lensing.

By way of example, modelling of a current rf device configuration has been performed with and without a diamond heat spreader and compared with a graded diamond heat spreader where the thickness of the high/low thermal conductivity diamond layers is part of the sensitivity analysis.

The analysis has shown that a graded diamond heat spreader as described herein gives a similar thermal performance to a uniform high thermal conductivity diamond heat spreader with significant benefits of material cost reduction and increased capacity. Using a production cost model for a diamond heat spreader consisting of a 1500 W/mK base diamond layer and a higher thermally conductivity diamond surface layer shows a route for material cost reduction >20% along with an equivalent >1.5 times increase in production capacity.

Figure 6:
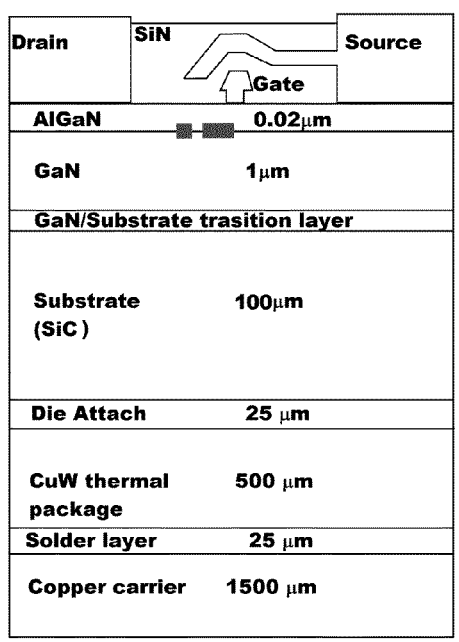
FIG. 6(a) shows an example of a GaN on SiC RF power amplifier device configuration with no diamond heat spreader (i.e. not according to the present invention)
FIG. 6(b) shows an example of a GaN on SiC RF power amplifier device configuration with a diamond heat spreader on top of the CuW thermal package.
Figure 6:
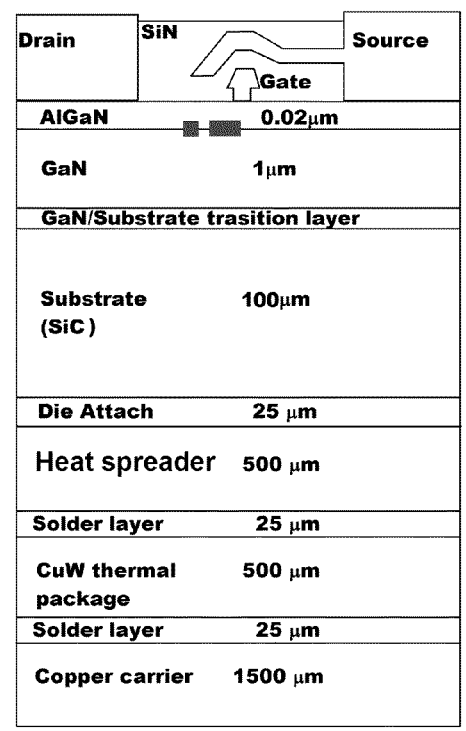
Figure 7:
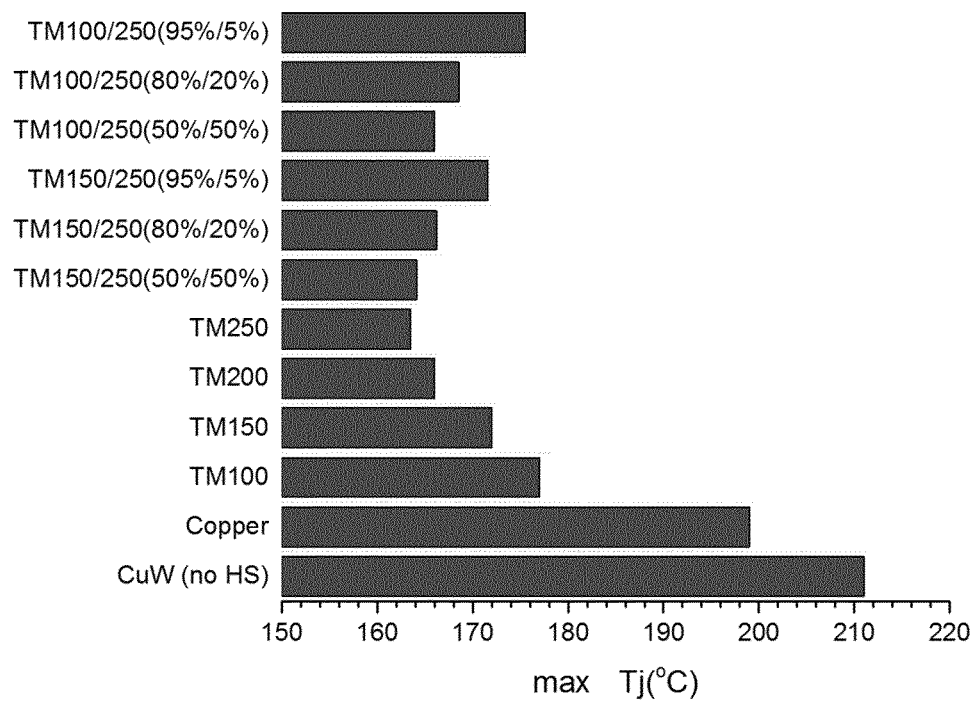
FIG. 7 shows modelling results indicating the maximum junction temperature, max $T_j(°\ C.)$, based on the device configurations of FIGS. 6(a) and 6(b) for various types of heat spreader.

The benchmark device is a GaN on SiC RF power amplifier on a real package as illustrated in FIG. 6(a) with no diamond heat spreader. FIG. 6(b) shows a comparison device with a diamond heat spreader (of dimensions 6 mm×4 mm×0.5 mm) on top of the CuW thermal package. Modelling has been performed for various combinations of commercially available grades of diamond material from Element Six Limited. Results are illustrated in FIG. 7 showing the maximum junction temperature, max $T_j$(° C.), for the device configuration with no heat spreader on the CuW package (>210° C.), using a copper heat spreader (approx. 200° C.), using various grades of diamond heat spreader (max T, reduced to approx. 163° C. for TM250), and using various graded diamond substrates in accordance with the present invention. Importantly, it is shown that for certain graded configurations, such as a layered structure of 50% TM150 and 50% TM250, the maximum junction temperature approaches that achieved for a heat spreader made entirely from the more expensive TM250 and provides a 20% reduction in maximum junction temperature compared with a device with no diamond heat spreader.

Figure 8:
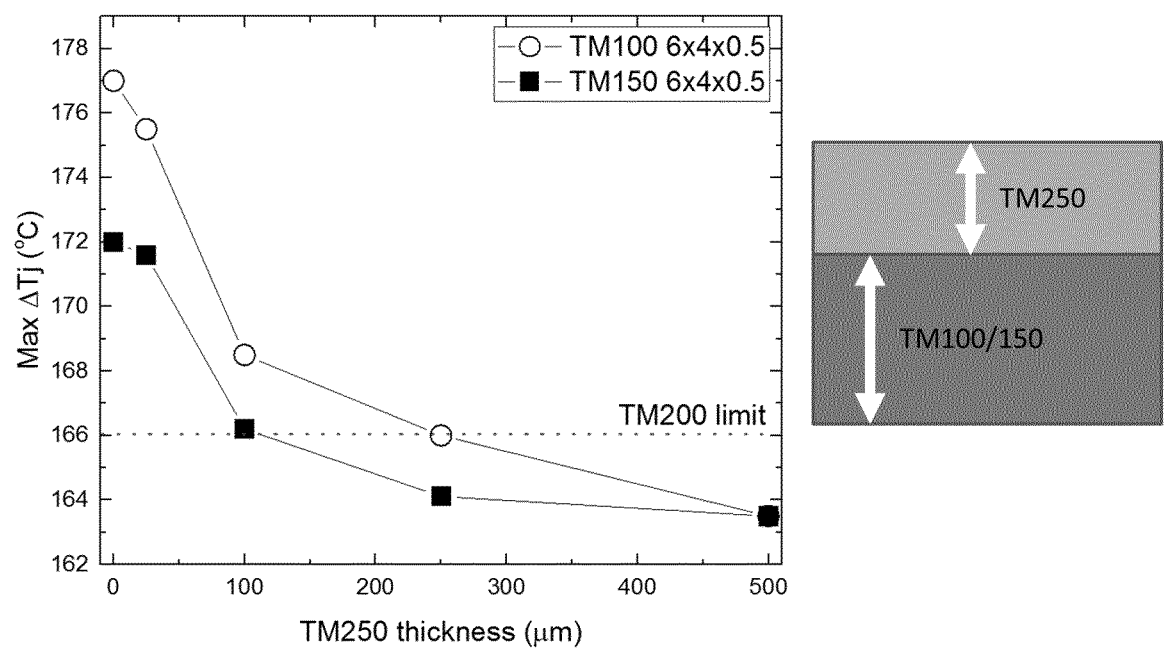
FIG. 8 shows an example of how the maximum junction temperature, max $T_j(°\ C.)$, varies with thickness of a high thermal conductivity diamond layer (TM250 which has a thermal conductivity of 2500 W/mK) on a lower thermal conductivity diamond layer (TM100 or TM150 which have thermal conductivities of 1000 W/mK and 1500 W/mK respectively)

FIG. 8 shows an example of how the maximum junction temperature, max $T_j$(° C.), varies with thickness of a high thermal conductivity diamond layer (TM250) on a lower thermal conductivity diamond layer (TM100 or TM150). Notably, a 100 micrometre thick layer of TM250 on top of a 400 micrometre thick layer of TM150 gives the same thermal performance as a 500 micrometre thick TM250 heat spreader. If a TM100 diamond material is utilized as the base layer then a 250 micrometre thick layer of TM250 on a 250 micrometre thick layer of TM100 gives the same thermal performance as a 500 micrometre thick TM250 heat spreader.

Figure 9:
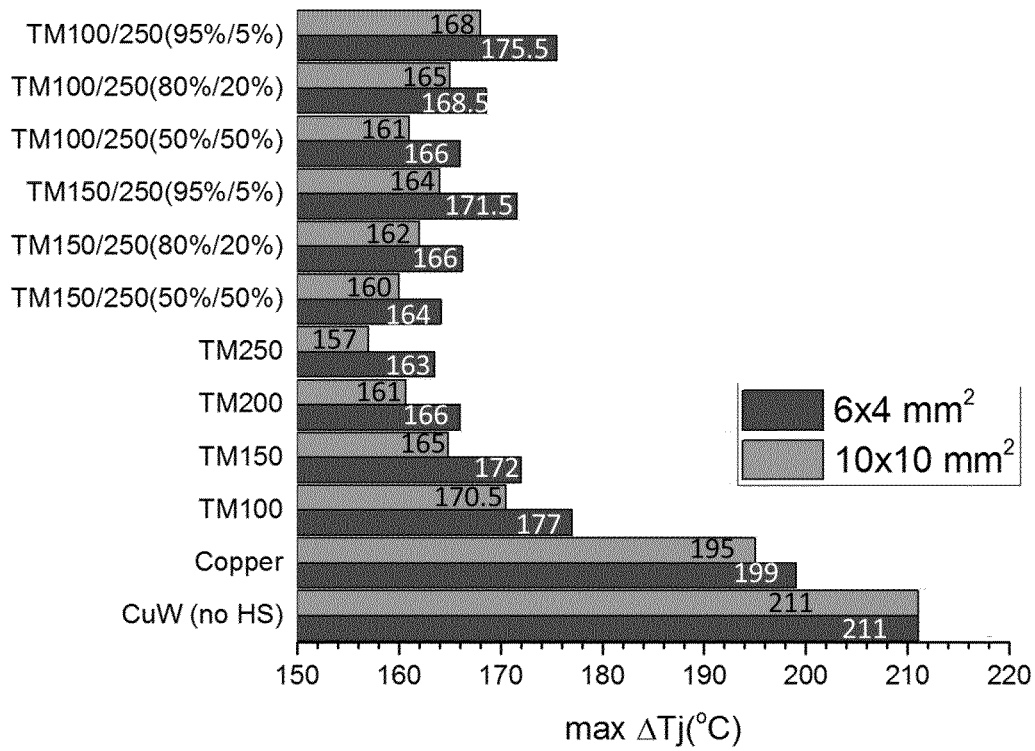
FIG. 9 shows an example of how the maximum junction temperature, max $T_j$(° C.), varies with both the type of heat spreader and the size of the heat spreader.

FIG. 9 shows an example of how the maximum junction temperature, max $T_j$(° C.), varies with both the type of heat spreader and the size of the heat spreader comparing a 6 mm×4 mm heat spreader with a 10 mm×10 mm size heat spreader. Results indicate that the graded diamond heat spreader approach can be effectively scaled to different sizes of heat spreader and a further reduction in maximum junction temperature can be achieved by moving to a larger heat spreader. A 25% reduction in maximum junction temperature is achieved for the larger heat spreader and a 20% reduction in maximum junction temperature is achieved for the smaller heat spreader as compared to the device configuration with no heat spreader.

Figure 10:
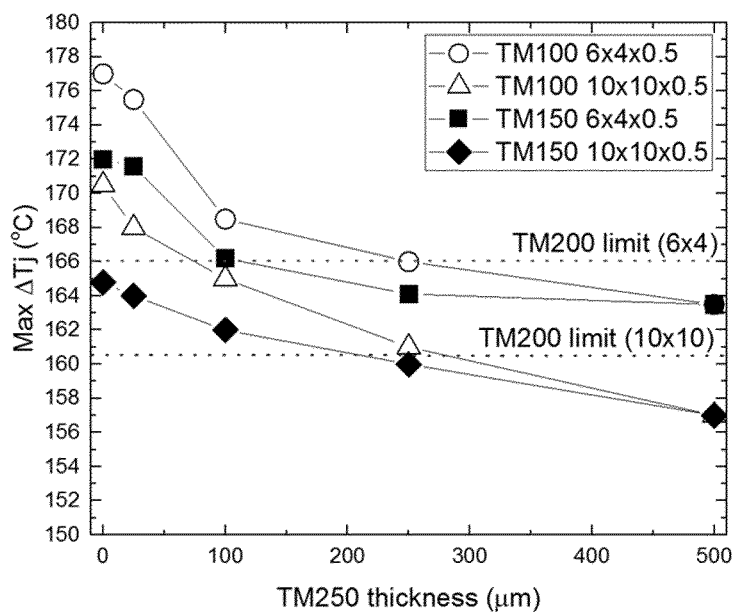
FIG. 10 shows an example of how the maximum junction temperature, max $T_j$(° C.), varies with thickness of a high thermal conductivity diamond layer (TM250) on a lower thermal conductivity diamond layer (TM100 or TM150) for two different sizes of heat spreader.

FIG. 10 shows an example of how the maximum junction temperature, max $T_j$(° C.), varies with thickness of a high thermal conductivity diamond layer (TM250) on a lower thermal conductivity diamond layer (TM100 or TM150) for two different sizes of heat spreader. Again, the results indicate that the graded diamond heat spreader approach can be effectively scaled to different sizes of heat spreader.

The synthetic diamond heat spreaders as described herein are tailored to produce exceptional thermal performance while not incurring excessive cost increases which would otherwise render the materials commercially unviable. They achieve this advantageous combination of features by targeting improvements in thermal performance only at a thermal interface region. In use, a device may be provided comprising a heat generating component and a synthetic diamond heat spreader as described herein, wherein the synthetic diamond material is located adjacent the heat generating component with the diamond surface layer proximal to at least a portion of the heat generating component. For example, the synthetic diamond material may be bonded to the heat generating component via the diamond surface layer.

While this invention has been particularly shown and described with reference to preferred embodiments, it will be understood to those skilled in the art that various changes in form and detail may be made without departing from the scope of the invention as defined by the appendant claims.

The invention claimed is:

1. A polycrystalline CVD synthetic diamond heat spreader, the synthetic diamond heat spreader comprising:
   a first layer of synthetic diamond material forming a base support layer; and a second layer of synthetic diamond material disposed on the first layer of synthetic diamond material and forming a diamond surface layer, wherein the diamond surface layer has a thickness equal to or less than a thickness of the base support layer, wherein the diamond surface layer has a nitrogen content less than that of the base support layer, wherein the nitrogen content of the diamond surface layer is in a range 0.25 to 5 ppm and the nitrogen content of the base support layer is in a range 2 to 10 ppm, and wherein the nitrogen content of the diamond surface layer and the base support layer is selected such that the thermal conductivity of the base support layer measured at 300 K is in a range 1000 $Wm^{-1}K^{-1}$ to 1800 $Wm^{-1}K^{-1}$ and the thermal conductivity of the diamond surface layer measured at 300 K is in a range 1900 $Wm^{-1}K^{-1}$ to 2800 $Wm^{-1}K^{-1}$.

2. The polycrystalline CVD synthetic diamond heat spreader according to claim 1, wherein the thermal conductivity of the diamond surface layer measured at 300 K is in a range 2000 $Wm^{-1}K^{-1}$ to 2200 $Wm^{-1}K^{-1}$.

3. The polycrystalline CVD synthetic diamond heat spreader according to claim 1, wherein the thermal conductivity of the base support layer measured at 300 K is in a range 1000 $Wm^{-1}K^{-1}$ to 1500 $Wm^{-1}K^{-1}$.

4. The polycrystalline CVD synthetic diamond heat spreader according to claim 1, wherein the base support layer has a thickness of no less than 50 μm, 100 μm, 130 μm, 150 μm, 180 μm, 200 μm, 250 μm, 350 μm, 500 μm, or 1000 μm.

5. The polycrystalline CVD synthetic diamond heat spreader according to claim 1, wherein at least 50%, 60%, 70%, 80%, or 90% of the thickness of the synthetic diamond material is formed of the base support layer.

6. The polycrystalline CVD synthetic diamond heat spreader according to claim 1, wherein the diamond surface layer has a thickness of no more than 300 μm, 250 μm, 200 μm, 150 μm, 100 μm, or 50 μm.

7. The polycrystalline CVD synthetic diamond heat spreader according to claim 1, wherein the synthetic diamond material is polycrystalline CVD synthetic diamond material, and the polycrystalline CVD synthetic diamond material has a largest linear dimension of at least 50 mm, 60 mm, 70 mm, 80 mm, 90 mm, 100 mm, 110 mm, 120 mm, 130 mm, or 140 mm.

8. The polycrystalline CVD synthetic diamond heat spreader according to claim 1, wherein the polycrystalline CVD synthetic diamond heat spreader further comprises a non-diamond thermal transfer layer disposed in contact with the diamond surface layer for transferring heat into the diamond surface layer from a heat generating component which is thermally coupled to the non-diamond thermal transfer layer.

9. The polycrystalline CVD synthetic diamond heat spreader according to claim 8, wherein the non-diamond thermal transfer layer comprises at least one of:
a metal layer;
a silicon or silicon carbide layer;
a compound semiconductor layer; or
an adhesive.

10. A device comprising a heat generating component and the polycrystalline CVD synthetic diamond heat spreader according to claim 1, wherein the polycrystalline CVD synthetic diamond heat spreader is located adjacent the heat generating component with the diamond surface layer proximal to the heat generating component and the base support layer distal to the heat generating component.

11. A method of fabricating the polycrystalline CVD synthetic diamond heat spreader according to claim 1, the method comprising:
growing the polycrystalline CVD synthetic diamond material in a chemical vapour deposition reactor using a carbon source gas; and
controlling nitrogen concentration in the chemical vapour deposition reactor during growth to form a two layer diamond structure including a base support layer and a diamond surface layer wherein the nitrogen content of the diamond surface layer and the base support layer is selected such that the thermal conductivity of the base support layer measured at 300 K is in a range 1000 $Wm^{-1}K^{-1}$ to 1800 $Wm^{-1}K^{-1}$ and the thermal conductivity of the surface support layer measured at 300 K is in a range 1900 $Wm^{-1}K^{-1}$ to 2800 $Wm^{-1}K^{-1}$.

* * * * *